US006806713B2

(12) United States Patent
Wong (10) Patent No.: US 6,806,713 B2
(45) Date of Patent: Oct. 19, 2004

(54) RF COIL FOR MAGIC ANGLE SPINNING PROBE

(75) Inventor: Wai Ha Wong, San Jose, CA (US)

(73) Assignee: Varian, Inc., Palo Alto, CA (US)

( * ) Notice: Subject to any disclaimer, the term of this patent is extended or adjusted under 35 U.S.C. 154(b) by 72 days.

(21) Appl. No.: 10/271,049

(22) Filed: Oct. 15, 2002

(65) Prior Publication Data

US 2004/0070398 A1 Apr. 15, 2004

(51) Int. Cl.[7] .................................................. G01V 3/00
(52) U.S. Cl. ...................................... 324/318; 324/307
(58) Field of Search ................................ 324/300, 307, 324/309, 318, 321, 322

(56) References Cited

U.S. PATENT DOCUMENTS

| | | | |
|---|---|---|---|
| 4,766,383 A | * | 8/1988 | Fox et al. .................... 324/318 |
| 5,754,048 A | * | 5/1998 | Bielecki ...................... 324/321 |
| 6,118,274 A | | 9/2000 | Roffmann et al. |
| 6,359,437 B1 | | 3/2002 | Barbara et al. |
| 6,420,871 B1 | | 7/2002 | Wong et al. |
| 6,509,737 B1 | * | 1/2003 | Bronnimann ................ 324/318 |

OTHER PUBLICATIONS

Article by C.E. Hayes entititled "An Efficient, Highly Homogeneous Radiofrequency Coil for Whole–Body NMR Imaging at 1.5 T" published by Journal of Magnetic Resonance, 63, pp. 622–628 (1985).

* cited by examiner

Primary Examiner—Diego Gutierrez
Assistant Examiner—Dixomara Vargas
(74) Attorney, Agent, or Firm—Edward H. Berkowitz; Bella Fishman (57) ABSTRACT

A multimode RF probe for use with a sample oriented at an angle $\theta$ to a polarizing field $B_0$ produces a resultant RF magnetic field exhibiting enhanced coupling to the sample. The multiple modes are furnished by a quadrature coil, or a solenoidal coil in combination with either a saddle coil or quadrature coil.

16 Claims, 7 Drawing Sheets

Figure 1

PRIOR ART

Figure 1a

PRIOR ART

RF COIL FOR MAGIC ANGLE SPINNING PROBE

FIELD OF THE INVENTION

This invention is in the technical field of nuclear magnetic resonance (NMR) and more particularly relates to an NMR probe capable of generating an optimized RF magnetic field orthogonal to a polarizing field for study of a sample rotating about an axis oriented at a specified angle from the direction of the polarizing field.

BACKGROUND OF THE INVENTION

It has been known in the analysis by magnetic resonance to rotate a sample at a high speed $\omega_s$ in a uniform magnetic polarizing field around a sample rotation axis directed along a selected angle $\theta$ from the direction of this polarizing field ($B_0$) to average over dipolar couplings in the sample and to average over spatial inhomogeneities of the sample. The selected angle is frequently the so-called magic angle, which is defined as the zero of the function $3\cos^2\theta - 1$, or about 54° 44'.

In order to achieve a desired distribution of RF magnetic field ($B_1$) over the volume of the sample, it has been known to provide a solenoidal coil with the coil former support structure oriented on the axis of rotation of the sample (or the sample container). Consider FIG. 1. The RF magnetic field $B_1^s$ generated by such a solenoidal coil (represented here by resonator 8) is in the direction of the axis of rotation 9 but it is the component of this field perpendicular to the polarizing field $B_0$ that is of importance in NMR applications, that is, the projection of $B_1^s$ on the x-y plane. For simplicity, let the rotation axis be in the z-y plane and let the angle between the direction of the polarizing field $B_0$, and the axis of rotation (solenoid axis) be $\theta$ and the RF phase for the solenoid is $\rho_s$. It follows that $$B_1^s B_1^s \sin\theta \cos(\omega t + \rho_s)Y + B_1^s \cos\theta \cos(\omega t + \rho_s)Z$$

Figure 1:
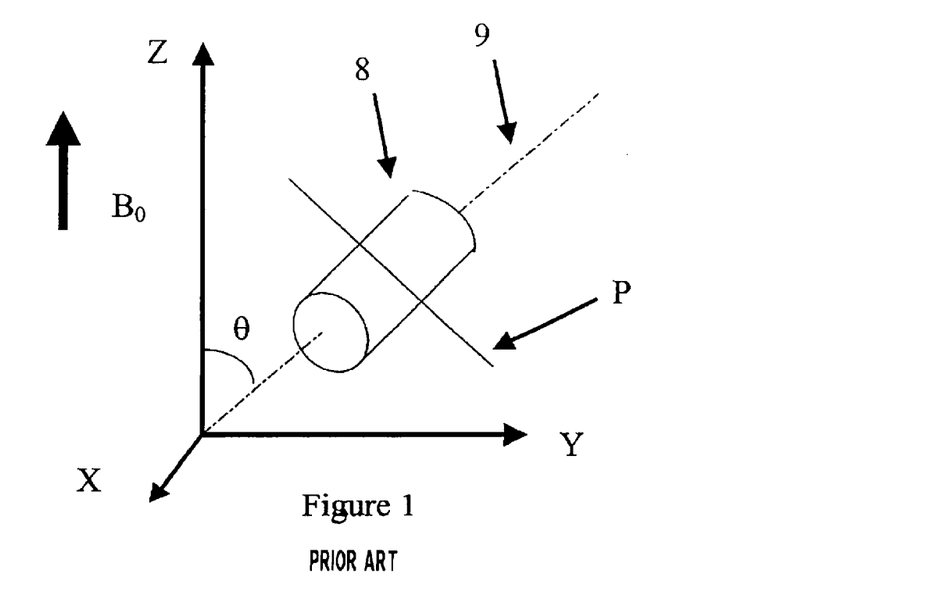
FIG. 1 describes the geometry characterizing RF magnetic fields of importance herein.

The effective field component due to the solenoid is limited to the projection onto the x-y plane and thus will be $$B_1^s{}_{\text{effective}} = B_1^s \sin\theta \cos(\omega t + \rho_s)Y \quad (\text{Equ.1})$$

If $\theta$ is the magic angle, the effective field will be about $0.816 B_1$ for such prior art.

It is desired to increase the $B_1$ field available for manipulation of nuclear spins and to increase the signal-to-noise ratio for resonance detection when an axially symmetric probe coil is inclined with respect to $B_0$. It is known to produce an RF field at a small angle with respect to the solenoidal axis of a solenoidal RF coil by tilting the approximate plane (of a current loop) to the solenoidal axis. The $B_1^s{}_{\text{effective}}$ vector resulting from this known arrangement is approximately inclined by the tilt angle with respect to the axis of the coil support. However, the vector is smeared over a cone (cone-angle equal to the tilt angle) in accordance with the distribution of normals to the non-coplanar surface enclosed by the current "loop".

SUMMARY OF THE INVENTION

It is therefore an object of this invention to provide more effective RF coils for a spinning probe which may be oriented at a selected angle with respect to the static field and in particular, at the magic angle.

Saddle coil and birdcage coil geometries each produce an RF magnetic field in the plane perpendicular to their geometric symmetry axis which may be identified with the solenoidal/sample rotation axis.

A birdcage coil having a pair of angularly displaced RF ports, each tuned to the same resonance frequency produces (on excitation) a plane polarized RF magnetic field. Where the two amplitudes are equal, the angular displacement is 90° and the phase difference is $\pi/2$, the polarization will be circular in the median plane of the birdcage coil. (The present invention is not limited to quadrature mode/circular polarization; in some cases, elliptical polarization may be desirable, in order to produce circular polarization projected onto the x-y plane). For simplicity, reference to circular polarization is intended to comprehend elliptical polarization and quadrature mode is representative of multi-mode coils in general.) A quadrature birdcage coil disposed with its axis oriented at $\theta$ with respect to a polarizing field $B_0$ along Z is again identifiable with resonator 8 of FIG. 1. The analysis is simplified if the rotation axis is again assumed to lie in the z-y plane and the two (quadrature) modes are of equal amplitude and characterized by phases $\rho_B$ and $\rho_B + \pi/2$.

$$B_1^B = B_1^B \cos(\omega t + \rho_B) X (\text{first mode}) + [B_1^B \cos\theta \cos(\omega t + \rho_B + \pi/2) Y + B_1^B \sin\theta \sin(\omega t + \rho_B + \pi/2) Z] (\text{second mode})$$

Noting that only the X and Y contribute to NMR excitation phenomena, one has $$B_1^B{}_{\text{effective}} = B_1^B \cos(\omega t + \rho_B) X + B_1^B \cos\theta \cos(\omega t + \rho_B + \pi/2) Y \quad (\text{Equ. 2})$$

and these two terms are identified with the RF magnetic field components (oscillating in the plane P). The plane of polarization for the birdcage coil is that plane orthogonal to its cylindrical axis and will be referenced where appropriate as the P plane. Relaxing the condition of equal amplitudes for the two modes, one obtains an elliptically polarized wave in the plane P. With an appropriate choice of these amplitudes the elliptical polarization on the plane P will be projected onto the x-y plane as a circularly polarized wave, as discussed below.

A saddle coil may be disposed with its symmetry axis directed at an angle to $B_0$. A single saddle coil produces linear polarization in the plane transverse to the inductive members of the coil, that is, transverse to the symmetry axis of the coil. The saddle coil may be rotated about its geometric axis to orient the polarization axis in a plane orthogonal to $B_0$ whereby the RF magnetic field is optimized for a desired sample rotation axis orientation.

Plane polarized or linearly polarized RF fields may be vectorialy added to a solenoidal field to produce a resultant RF magnetic vector exhibiting a greater projection on the plane orthogonal to the uniform field $B_0$ as compared to the solenoidal field component alone. The greater RF field projection on the x-y plane, orthogonal to $B_0$, is more efficacious for NMR excitation and the same features which allow this greater coupling to the sample on excitation also promotes a closer coupling to the resonant de-excitation of the sample.

A spinning NMR probe according to this invention may be characterized as comprising not only a container for containing a sample, and means for rotating the container around an axis of rotation which makes a specified non-zero angle (such as the magic angle) but also a saddle coil resonator or a multi-mode resonator disposed around the sample and arranged along the axis of rotation of the sample container and means for exciting the saddle coil or multi-mode resonator to thereby provide a resultant $B_1$ field having a major component perpendicular to the axis of rotation. In most familiar NMR applications the multi-mode resonator is represented by a quadrature coil and reference to quadrature coils throughout this work should be understood to include more general multi-mode coils where applicable. The quadrature coil may be a paraxial birdcage coil with rungs extending parallel to its central axis. Where such a coil is employed with quadrature detection/excitation, instead of a solenoid coil according to the prior art, the $B_1(P)$ field generated thereby is perpendicular to its symmetry axis(also the axis of rotation of the sample container). The $B_1(P)$ field of the present invention is characterized by a rotating vector (circularly or elliptically polarized field) rotating in the plane P transverse to the inductors of the quadrature coil.

In certain embodiments of the present invention, the vector $B_1(P)$ rotating in plane P or oscillating along an axis in plane P, couples to another vector $B_1(S)$, e.g., an axial field tuned to the same resonance frequency with a selected phase difference to $B_1(P)$ to produce a resultant $B_1$. Assume that $B_1(P)$ and $B_1(S)$ are orthogonal. In the most general case, the tip of this resultant vector describes a 3D Lissajous figure of considerable complexity. Much complexity is removed when the frequencies of the two components are equal, as in the present invention. Where a saddle coil provides the RF field in the plane P, $B_1(P)$ is linearly polarized along a selected axis in P and in conjunction with an axial field -$B_1(S)$- the tip of the resultant vector executes a 2D Lissajous figure in the plane containing the solenoidal axis and the magnetic axis of the saddle coil. Altogether, for the invention, the total effective RF magnetic field comprising vectors $B_1(S)$ coupled to $B_1(P)$ will be greater than $0.816B_1$ of prior art utilizing a simple solenoid oriented at the magic angle. The measure of efficacy for magnetic resonance is the relative magnitude of the RF field component of $B_1$ which lay in that plane to which the polarizing field $B_0$ is normal. It is when the RF magnetic field $B_1$ is realized from a resonator inclined at some angle with respect to $B_0$ that such $B_1$ field is also inclined and presents some component parallel to $B_0$ and this parallel component is ineffective for resonance excitation. In order to maximize resonance excitation, it is desired to maximize the projection of $B_1$ on the x-y plane that is orthonormal to $B_0$.

Two coils producing orthogonally oriented RF magnetic field components at frequency $\omega_0$ may be combined to form an NMR probe for generating an RF field having components at selected orientations. A birdcage coil as described above in combination with a solenoid disposed coaxially, with one coil disposed inside the other, will provide such selected RF field orientations. A straightforward generalization of equ.2 is obtained for addition of an RF field from a solenoid oriented along an axis θ inclined from z (and for notational convenience in the y-z plane) by adding the component of the solenoidal field, $B_1^s$, projected on y:

$$B_1^{total}=B_1^B \cos(\omega t+\rho_B)X+B_1^B \cos\theta \cos(\omega t+\rho_B+\pi/2)Y+B_1^S \sin\theta \sin(\omega t+\rho_s)Y \quad \text{(Equ.3)}$$

In this case, the birdcage coil provides two orthogonal RF modes and the solenoid provides a third RF mode. Three distinct RF ports may be derived from such a probe forming three channels which may, for example, be connected to three parallel RF sources, or receivers for simultaneous (parallel) excitation, or detection.

A coaxial combination of saddle coil and solenoid coil is another example of the invention.

According to another, single coil embodiment of the invention, the quadrature coil is a birdcage coil of a skewed, or spiral geometry with rungs spiraling around its center axis where each skewed turn defines a normal vector making the same non-zero angle with the axis of rotation as the angle between the axis of rotation with the direction of the magnetic field $B_0$. The two quadrature modes are then both perpendicular to the magnetic field $B_0$ whereby the greatest geometric efficacy is obtained. The skewed geometry provides an axial component whereby the single birdcage coil produces the characteristically large volume homogeneous RF field at a selected orientation to the polarizing field with enhanced resonance coupling to the sample.

A probe in a multiple-tuned configuration may be formed with multiple-tuned coils, say, with a paraxial birdcage coil disposed at a tilted angle with respect to the magnetic field $B_0$ coaxially disposed inside another birdcage coil of the skewed rung variety as described above.

More generally, a probe according to this invention may be formed with any two orthogonal $B_1$ coils such as a saddle coil and a solenoid coil, both coils having common resonance properties and selected phase difference.

BRIEF DESCRIPTION OF THE DRAWINGS

The sample container and the means for rotating it are not shown in all of the figures for the sake of not crowding the drawings. Circuits connected to the coils are schematically shown as "channels" in these figures.

DETAILED DESCRIPTION OF THE INVENTION

An NMR system for practice of the invention includes a magnet for creating a homogeneous static magnetic field, an RF source for excitation of the NMR phenomena and an RF receiver for detection of the nuclear magnetic resonance signal. Inasmuch as excitation and detection are non-concurrent functions, the same resonator is available for both functions if desired. A transmit/receive switch assures that the resonator communicates with either the excitation source or detector in accord with a command processor state while maintaining isolation of the source from the detector. Such systems are well known in the art.

A number of embodiments of the invention are described below. These represent trade-offs and compromises in certain properties, such as filing factor, tuning range, RF field homogeneity, power efficiency and the like.

Figure 2:
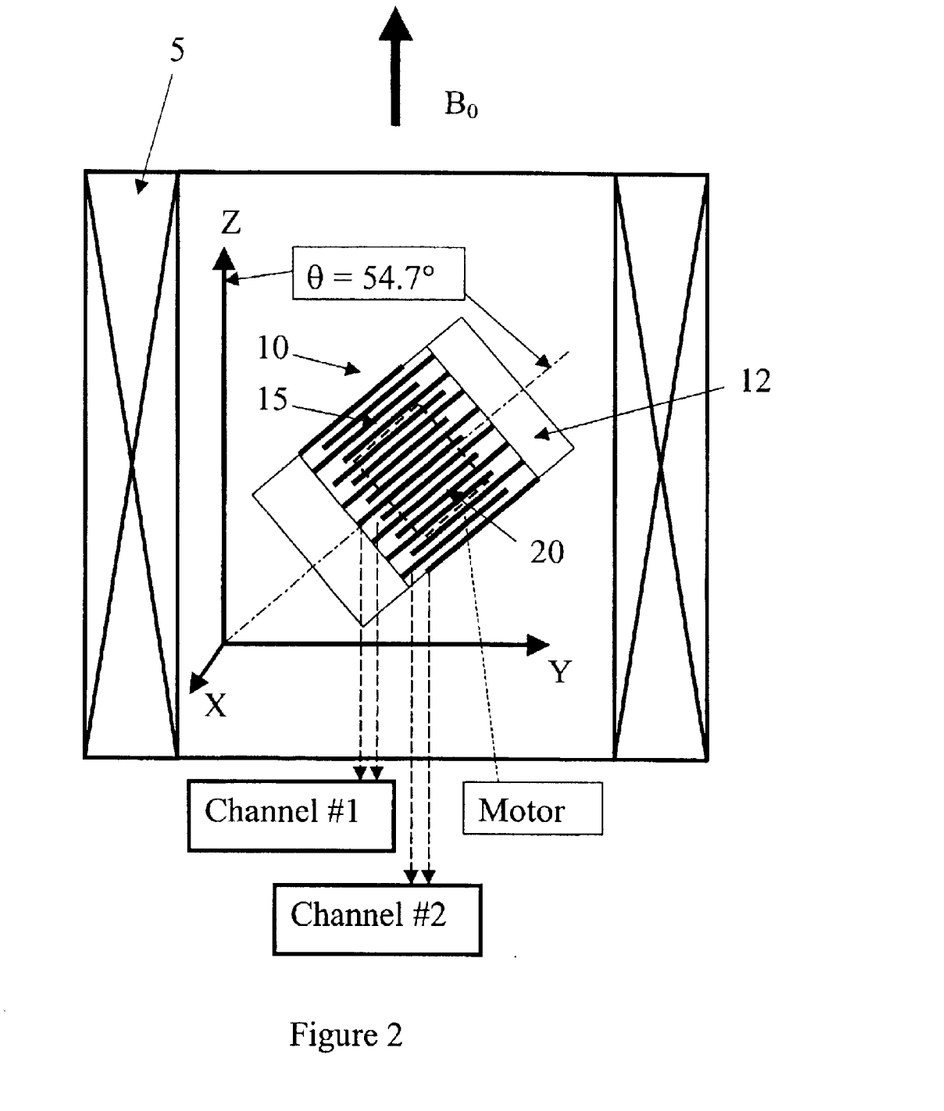
FIG. 2 is a schematic side view of a magic angle spinning probe embodying this invention for showing the directional relationships of its components.

FIG. 2 shows schematically the spatial relationship between a uniform polarization field is $B_0$ generated by a large magnet 5 and a cylindrical quadrature birdcage coil 10 of a known kind such as disclosed by C. E. Hayes, et al. in "An Efficient, Highly Homogeneous Radio Frequency Coil for Whole Body NMR Imaging at 1.5 T" (J. Magn. Reson., 63, 622–628), having a pair of conductive loop elements 12 separated from each other axially with respect to the central axis of its cylindrical shape and a plurality of conductive segments ("the rungs") 15 providing capacitance (not shown) and extending between and electrically interconnecting the loop elements. Inside the birdcage coil 10 there is placed a sample container 20 containing a sample for analysis. A Cartesian coordinate system is introduced for the convenience of description. The z axis is defined as extending in the direction of the uniform polarization field $B_0$ and the rotational axis of a rotating or otherwise oriented sample is defined such that the center axis of the cylindrical birdcage coil 10 lies in the y-z plane, making a specified angle $\theta$ with the z axis. The sample container 20 is adapted to rotate around this center axis in typical magic angle experiments. The means for rotating the sample container 20 is only schematically shown as "MOTOR" in FIG. 2. For the sake of not crowding the figures, the sample container 20 and the means for rotating it are not shown in the other figures.

The cylindrical birdcage coil 10, serving as a quadrature coil, is driven in a known manner such that the $B_1$ field generated thereby is perpendicular to and changes its direction azimuthally around its central axis (plane polarized) which is at angle $\theta$ from the z-axis. As explained above, however, what is of importance in NMR applications is the component of the plane polarized $B_1$ field that is perpendicular to the polarization field $B_0$. Twice during each RF period, the $B_1$ field is (instantaneously) parallel to the x axis, and thus the entire $B_1$ vector is perpendicular to the polarization field $B_0$. When the $B_1$ field is (instantaneously) in the y-z plane and inclined at $\theta$ to z, its component perpendicular to the polarization field $B_0$ is $B_1 \cos \theta$, or $(1/\sqrt{3})B_1$ if $\theta$ is the magic angle. In the limit of ideal coils, for the same power drawn from a RF source, the invention couples 3/2 as much RF power to a resonant spin system at the magic angle as compared to the prior art. It can be shown in general, that for identical power supplied to the prior art coil and the present inventive embodiment, the respective power coupled to the resonant spin system is $$P^s/P^B = 2(1+\cos^2 \theta)^{-1} = \Sigma \text{ and } 2 \geq \Sigma > 1$$

A birdcage coil so employed also has the advantage of a large filling factor and excellent RF homogeneity.

Figure 3:
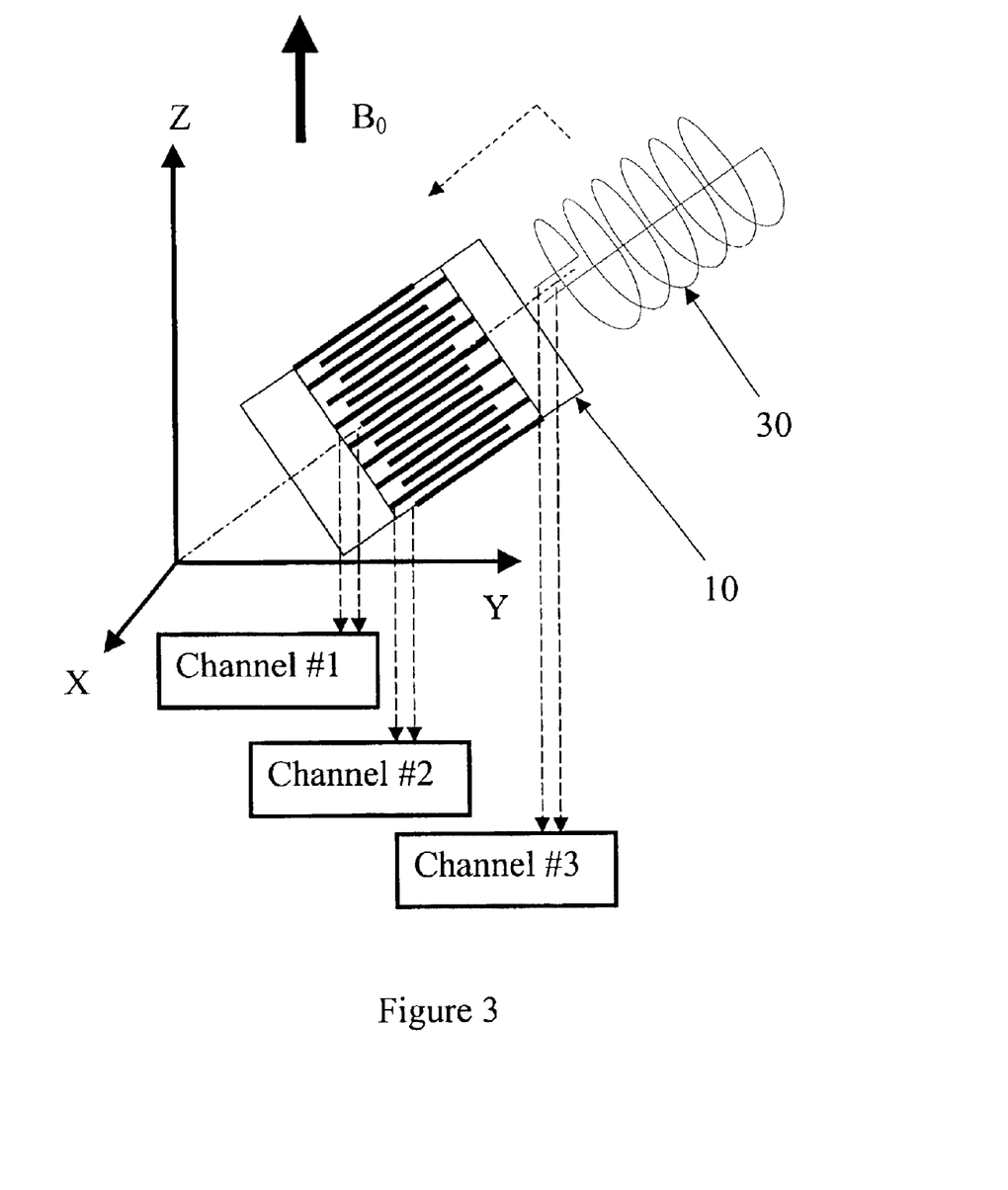
FIG. 3 is schematic side view of a magic angle spinning probe according to a second embodiment of the invention including a solenoid coil.
Figure 4:
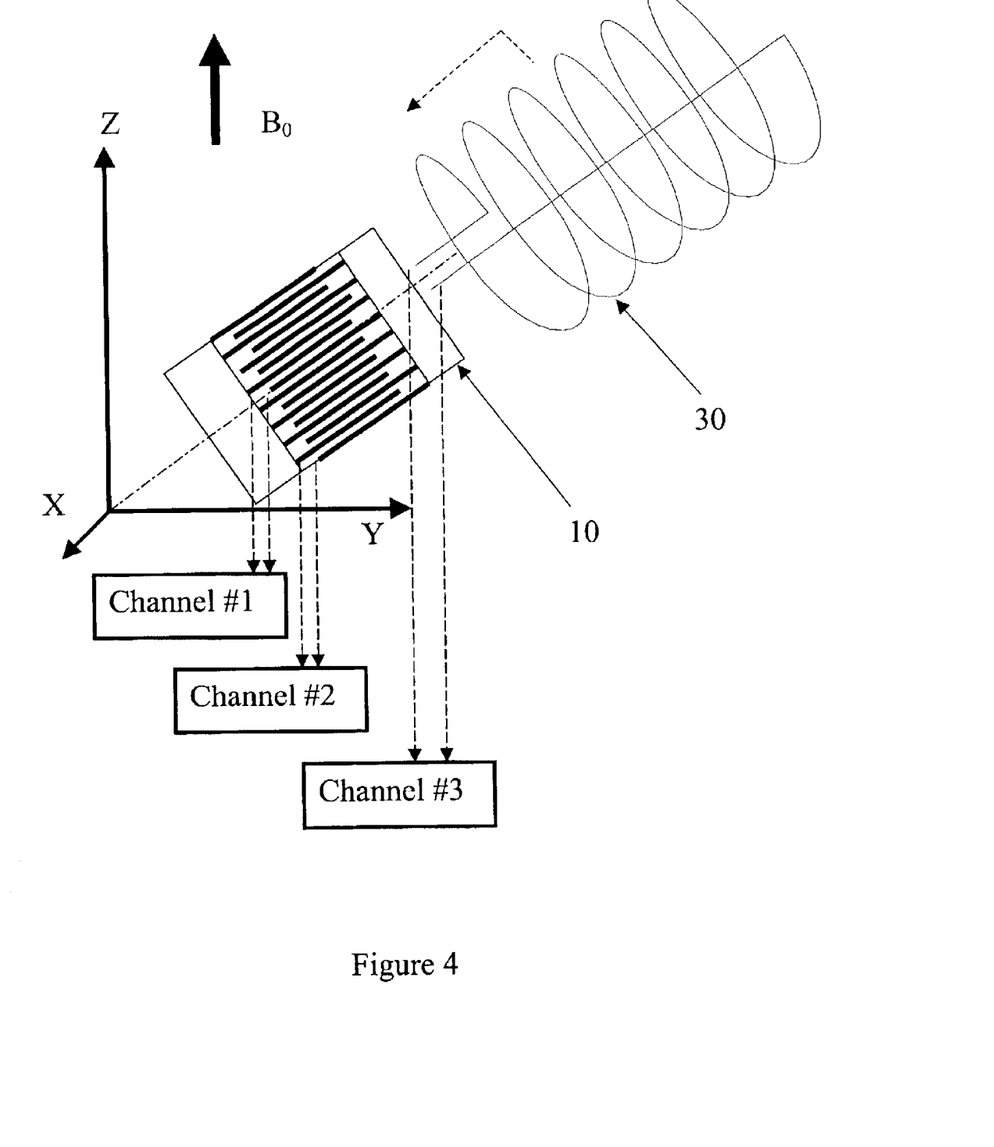
FIG. 4 is a variation of FIG. 3 with an outer solenoid coil and an inner quadrature coil.

FIGS. 3 and 4 show other spinning probes according to a second embodiment of the invention characterized as comprising not only a cylindrical quadrature birdcage coil 10 disposed with respect to a uniform polarization field B as shown in FIG. 2, but also a coaxial solenoid coil 30. Coaxial coils 10 and 30 are depicted as axially displaced for purposes of visual clarity. These coils are preferably (qualitatively) co-extensive on their common axis. In the example shown in FIG. 3, the solenoid coil 30 has a smaller radius than the cylindrical birdcage coil 10 and is inserted inside the birdcage coil 10 in a coaxial relationship therewith. In the example shown in FIG. 4, the solenoid 30 coil has a larger radius than the cylindrical birdcage coil 10 and the birdcage coil 10 is inserted inside solenoid coil 30 in a coaxial relationship therewith.

Probes according to this embodiment of the invention may be characterized essentially as having two mutually orthogonal coils, that is, a quadrature (or more generally a multi-mode) birdcage coil and a solenoid coil, the combination providing three ports communicating with three respective RF channels, supporting two mutually orthogonal modes derived from the respective ports of the quadrature birdcage coil and the third port from the solenoid. This arrangement accommodates three adjustable parameters in a typical configuration. Assigning reference values to one quadrature mode amplitude and phase, the second quadrature phase amplitude, the solenoidal phase and amplitude may be chosen to realize circular polarization on the x-y plane for arbitrary selected orientation $\theta$. It is also recognized that the greater RF power available for excitation from this embodiment is spread over three RF channels with relaxed RF power specifications for components in the several channels.

Figure 5:
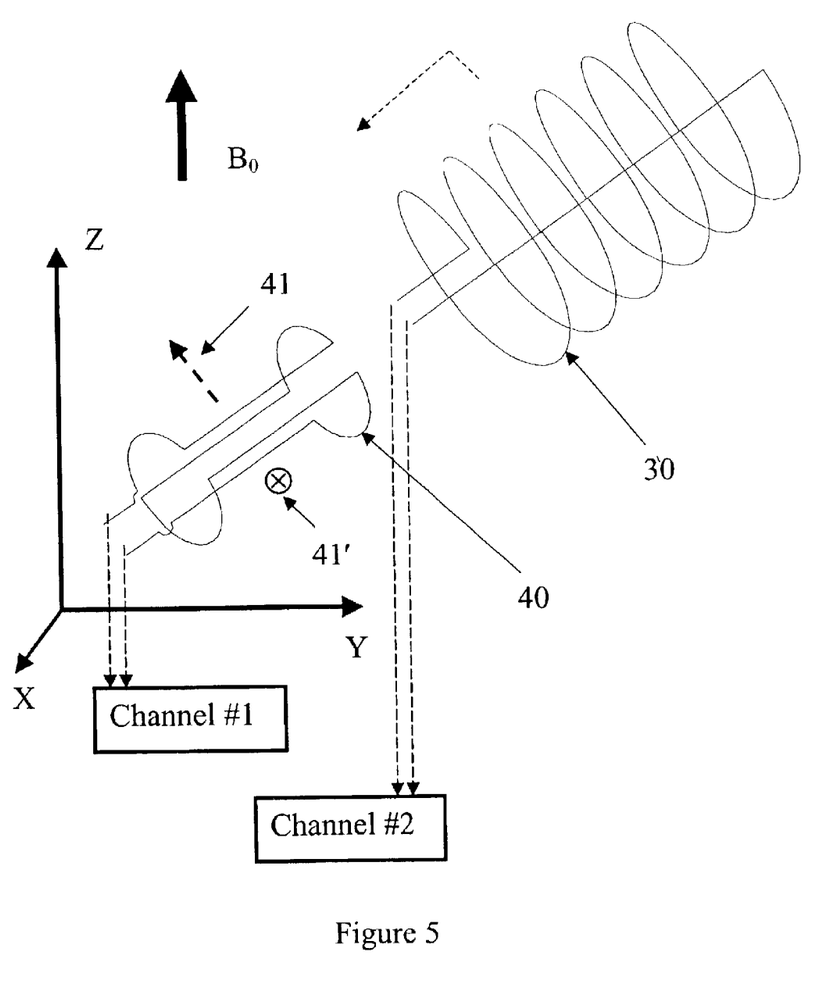
FIG. 5 is a schematic side view of a magic angle spinning probe comprising a saddle coil according to a variation of the second embodiment of the invention.

Spinning probes according to the second embodiment of the invention need not be comprised exclusively of a quadrature birdcage coil and a solenoid. FIG. 5 shows a variation of the second embodiment of the invention characterized as having a saddle coil 40 in place of the birdcage coil of FIG. 3. Although not separately shown, the saddle coil 40 may have a larger diameter than the solenoid coil 30 and having the smaller solenoid coil 30 supported coaxially within saddle coil 40. (The coils 30 and 40 are shown axially displaced only for visual clarity. These coils are preferably qualitatively co-extensive on their common axis.) As previously mentioned, a saddle coil produces a linearly polarized $B_1$ component in the plane transverse to the inductors of the saddle coil 40. For a general azimuthal orientation (as shown in FIG. 4 for visual clarity) of the saddle coil 40 about the rotational axis, this direction of linear polarization is represented by a field component along the magnetic axis 41. It should be apparent that the saddle coil may be azimuthally positioned about its symmetry axis such that the field component 41 will be parallel to x or more generally will be in the x-y plane as indicated by the vector 41'. While the resultant vector $B_1 = B_{axial} + B_{saddle}$ will execute a trajectory in a plane inclined to $B_0$, the projection of that trajectory on the x-y plane is still greater than 0.861 $B_1$(axial) of the prior art magic angle probe. This embodiment features excellent power efficiency because the entire saddle coil component of the RF excitation is always orthogonal to $B_0$. A further advantage for this embodiment is the relatively wide tuning range for the component coils.

Figure 6:
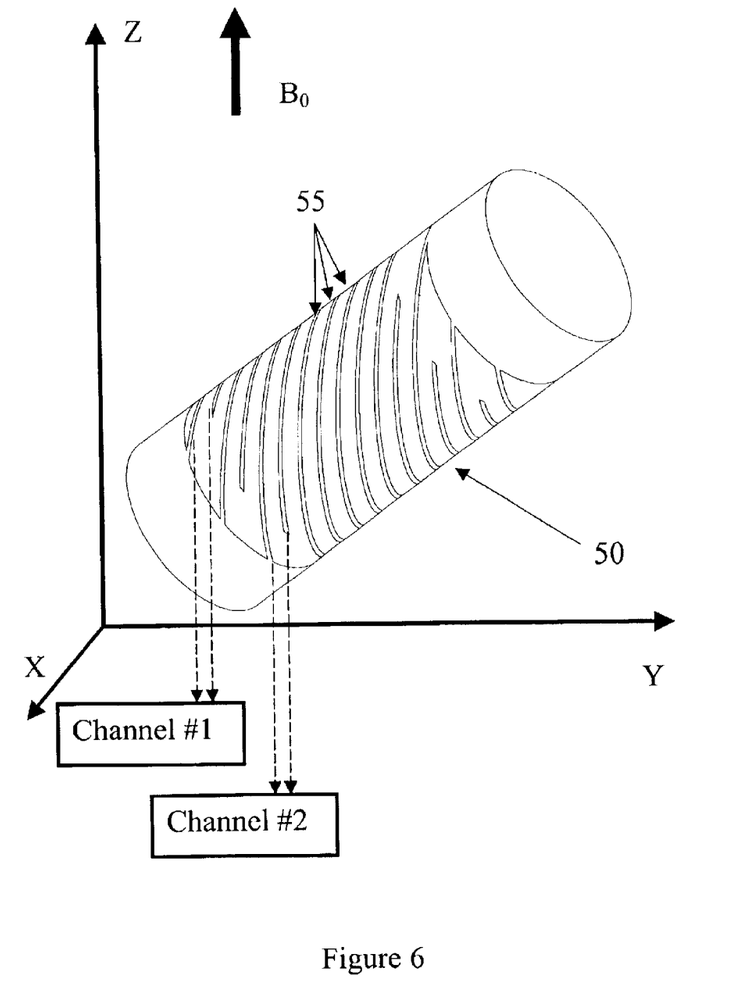
FIG. 6 is a schematic external view of a magic angle spinning probe according to a third embodiment of the invention comprising a skewed birdcage coil.

FIG. 6 shows a probe according to still another embodiment of the invention characterized as comprising a skewed quadrature birdcage 50 replacing the parallel rung birdcage coil shown in FIG. 2. A birdcage coil may be paraxial rung or skewed rung geometry. A paraxial rung birdcage, as shown in FIGS. 2–4, has rungs extending parallel to its axial direction. A spiral, or skewed birdcage coil has skewed rungs 55, twisted around the circumference of the cylindrical surface of the birdcage, forming a straight rung (on the cylindrical surface) between corresponding, azimuthally displaced points on the end/ring members of the birdcage coil or the rung may describe a curve on that cylindrical surface. Skewed birdcage coils have been used for improved homogeneity and are disclosed in U.S. Pat. No. 6,420,871, commonly assigned herewith.

According to this embodiment of the invention, the skewed rungs are tilted with respect to the central axis of the coil by the same angle as that made by the central axis of the coil with the z axis, e.g., the direction of the uniform polarization field $B_0$. With the tilting angle of the rungs thus selected in the present invention, the two quadrature modes of the skewed birdcage resonator both are perpendicular to $B_0$ in contrast with the single mode axial field of prior art or approximately axial field from the tilted turn solenoid of prior art. The RF magnetic field furnished in this embodiment is further characterized by a spiral symmetry where the field is uniform in each transverse median plane (orthogonal to the symmetry axis) and rotates in accord with the angular relationship of the skewed inductive rungs to the symmetry axis.

Figure 1A:
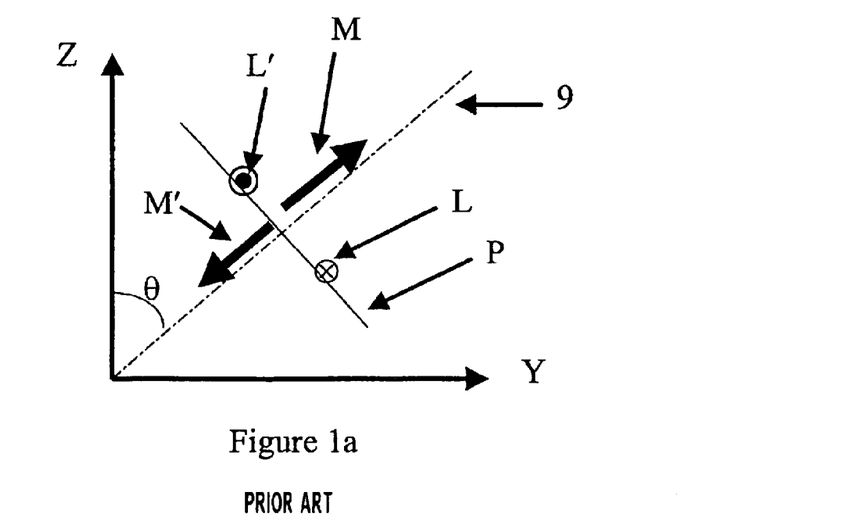

Certain parameter choices are favored to obtain advantages, for example, maximal coupling of RF energy from sources driving corresponding ports. The only portion of the RF power delivered to resonator(s) which excites resonance with nuclear spins precessing about $B_0$, is that represented by that portion of the RF field that is orthogonal to $B_0$. Moreover, the precessing nuclear spins absorbs energy only from that part (of the $B_0$ orthogonal) field that has the same rotational sense as the precessing spins. The plane polarized $B_1$ field in the x-y plane is is circularly polarized for maximum coupling to these resonant spins. Circular polarization in x-y implies elliptical polarization in planes intersecting x-y. For the embodiment of FIG. 2, the plane polarization in the median plane P of the resonator, the two modes birdcage coil are characterized by $\omega_1 = \omega_2$ and the phases are $\rho_2 = \rho_1 + \pi/2$. As illustrated in FIG. 1a, the amplitude L of the mode oscillating on the x axis is taken as minor axis of the elliptical polarization on the plane and the amplitude M of the major axis is selected such that as projected onto x-y, the projected amplitudes are equal. Thus, $$M \cos \theta = L$$

whereby the relative amplitudes applied to the respective ports are determined. It will be clear that an identical relation obtains for the embodiment of FIG. 5 where the saddle coil provides a single mode of amplitude L aligned on x and the solenoidal field projects onto y as $M \cos \theta$, thus establishing a choice of amplitude relationship for optimum RF coupling to the resonant spins.

Next consider the three port embodiment of FIG. 3 (or 4). There are now two amplitudes (birdcage modal amplitudes M and a solenoidal amplitude L) to select and the relative phase $\rho_s$ for the solenoidal field to treat as adjustable parameters to realize a desired state of polarization. From equation 3 it is now desired to obtain the vector sum of the birdcage quadrature modes and the solenoidal mode such that the resultant $B_1^{total}$ will project on the x-y plane to produce a circularly polarized wave, e.g., $$B_1^{xy} = B_1 \sin \theta \cos(\omega t) x + B_1 \cos \theta \sin(\omega t + \pi/2) y$$

It is apparent that a convenient choice of parameters to maximize RF power projected onto the x-y plane in a circular polarized state is one wherein the solenoid phase $\rho_s$ is equal to the phase of one of the (equal amplitude, $B_1^B$) birdcage modes and $$B_1^B = B_1^B \cos \theta + B_1^S \sin \theta$$

which is a condition for equal amplitudes of the projected modes on the x-y plane (circular polarization) whereby $$(1 - \cos \theta)/\sin \theta = B_1^S / B_1^B$$

This birdcage/solenoid embodiment permits the full RF power specified for the birdcage resonator to be dissipated in the circular polarized state on the x-y plane and this condition may be satisfied for arbitrary values of $\theta$.

Figure 7:
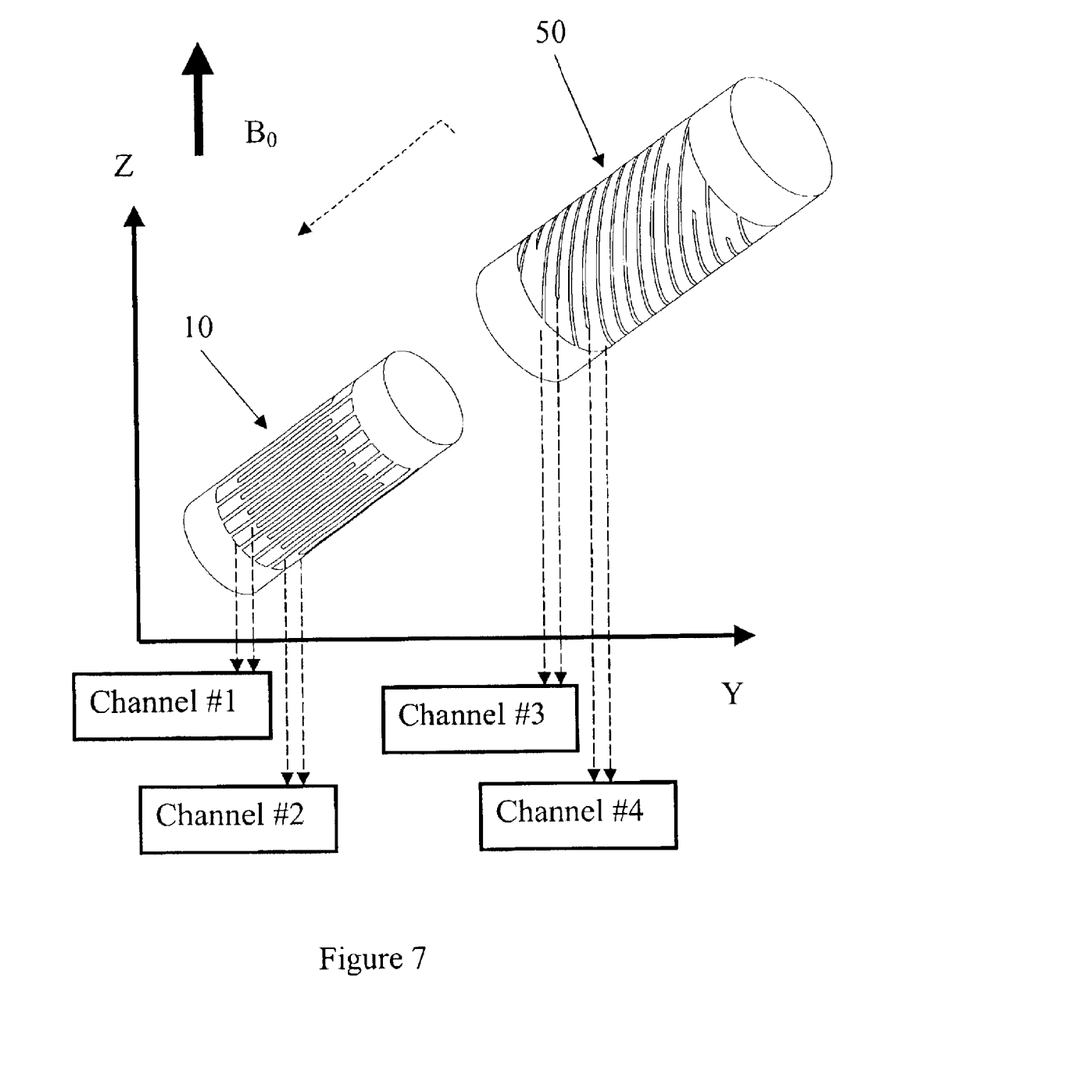
FIG. 7 is a schematic external view of a multiple-tuned magic angle spinning probe having two quadrature birdcage coils.

FIG. 7 shows a multiple-tuned configuration according to still another embodiment of the invention having a paraxial quadrature birdcage coil 10 shown in FIG. 2 inserted coaxially inside another skewed quadrature birdcage coil 50 as described above and shown in FIG. 6. (Coils 10 and 50 are shown axially displaced for visual clarity. These coils are preferably qualitatively co-extensive on their common axis.)

The two coaxial quadrature birdcage coils may be any combination of paraxial and/or skewed birdcage geometry. Each such coil is separately tuned to a corresponding resonant nuclear spin species. This embodiment represents an extension to the embodiments of FIGS. 2 and 6 directed to a double resonant experiment conducted at the magic angle.

Although the invention has been described with reference to only a limited number of embodiments and examples, they are not intended to limit the scope of the invention. Many modifications and variations are possible within the scope of the invention. For example, the positions of the quadrature birdcage coils 10 and 50 of FIG. 7 may be interchanged with the skewed quadrature birdcage coil 50 inserted inside the paraxial quadrature birdcage coil 10. Further, the invention offers adjustable parameters in its several embodiments other than choices set forth above, and these may be selected to satisfy criteria other than achievement of circular polarization on a given plane or maximum power dissipated as spin resonance. While the specific application for the invention described here is the magic angle inclined NMR experiment, the manipulation of the orientation of an RF field inclined in respect to a fixed direction is a central aspect of the invention.

What is claimed is:

1. An NMR probe for use with a polarizing magnetic field $B_0$, comprising:
    a resonator having a cylindrical axis R, said axis R inclined at an angle $\theta$ to $B_0$, said resonator sustaining a plurality of RF magnetic fields each comprising a distinct phase and direction, said resonator comprising an RF coil comprising two mutually isolated ports for maintaining two quadrature modes of said coil in operation, said modes each resonant at $\omega_1$.
    an RF source for exciting an RF magnetic field $B_1$, said field $B_1$ elliptically polarized in a plane orthogonal to said cylindrical axis R such that the projection of said elliptically polarized field onto a plane orthogonal to $B_0$ is circularly polarized, and
    a sample retainer for holding an elongate sample along said cylindrical axis.

2. The NMR probe of claim 1, further comprising a rotator for rotating said sample about said cylindrical axis R.

3. The NMR probe of claim 2, wherein said resonator comprises first birdcage coil resonant at $\omega_1$ and second birdcage coil resonant at $\omega_2$, said first and second birdcage coils disposed coaxially and co-extensively.

4. The NMR probe of claim 3, wherein at least one said birdcage coil comprises skewed inductors.

5. The NMR probe of claim 1, wherein said resonator comprises a birdcage coil.

6. The NMR probe of claim 5, herein said birdcage coil comprises paraxial inductors and said probe further comprising a solenoidal coil disposed coaxially and co-extensively with said birdcage coil, said solenoidal coil resonant at $\omega_1$.

7. The NMR probe of claim 6, wherein said solenoidal coil comprises another isolated RF port for exciting said solenoidal coil to produce in combination with said quadrature modes a resultant RF magnetic field $B_1$ such that said field $B_1$ projected onto a plane orthogonal to $B_0$ comprises a circularly polarized field.

8. The NMR probe of claim 5, wherein said birdcage coil comprises skewed inductors.

9. The NMR probe of claim 1, wherein said resonator comprises a saddle coil resonant at frequency $\omega_1$ having a magnetic axis mutually orthogonal to said cylindrical axis R and to $B_0$, and a solenoidal coil resonant at $\omega_1$ said solenoidal coil coaxialy and co-extensively disposed with said saddle coil.

10. The NMR probe of claim 9, wherein said saddle coil comprises a first RF channel and said solenoidal coil comprises a second RF channel to produce a resultant RF field such that said RF field projected onto a plane orthogonal to $B_0$ comprises a circularly polarized field.

11. An NMR system comprising:
   a magnet for producing a polarizing field $B_0$,
   an RF energy source,
   an RF receiver for detecting and resolving RF energy at selected frequency and phase, and
   an RF probe comprising a resonator having a cylindrical axis R, said axis R inclined at an angle $\theta$ to $B_0$, said resonator sustaining a plurality of RF magnetic fields each comprising a distinct phase and direction, said RF magnetic fields comprising elliptically polarization in a plane orthogonal to said cylindrical axis R such that the projection of said elliptically polarized field onto a plane orthogonal to $B_0$ is circularly polarized.

12. The NMR system of claim 11, wherein said RF probe further comprises a sample retainer for holding an elongate sample along said cylindrical axis R and rotating said sample about said axis R.

13. A method of establishing an RF magnetic field within an NMR probe of cylindrical symmetry comprising a symmetry axis, said RF magnetic field to exhibit a desired orientation with respect to another axis $B_0$ inclined with respect to said symmetry axis, comprising the steps of:
   (a) energizing a first RF magnetic field amplitude $A_1$ oriented along said symmetry axis at resonant frequency $\omega_0$, and phase $\rho_1$, and
   (b) in substantial concurrence with step (a), energizing a second RF magnetic field amplitude $A_2$ in a plane normal to said symmetry axis at resonant frequency $\omega_0$ and phase $\rho_2$,
   (c) choosing a phase difference $\rho_2 - \rho_1$, and said amplitudes $A_1$ and $A_2$ such that a circularly polarized wave is projected onto a plane orthogonal to $B_0$.

14. The method of claim 13, wherein said second RF magnetic field is linearly polarized in said plane orthogonal to $B_0$.

15. A method of establishing a plane polarized RF magnetic field within an NMR probe of cylindrical symmetry comprising a symmetry axis, said symmetry axis to exhibit a desired orientation with respect to another axis $B_0$ inclined with respect to said symmetry axis, comprising the steps of:
   (a) energizing a first RF magnetic field comprising vector amplitude $A_1$ in a plane orthogonal to said symmetry axis, said first RF field comprising resonant frequency $\omega_0$, amplitude $A_1$ and phase $\rho_1$; and
   (b) in substantial concurrence with step (a), energizing a second RF magnetic field comprising vector amplitude $A_2$ in said plane normal to said symmetry axis and orthogonal to said vector amplitude $A_1$ said second RF magnetic field comprising resonant frequency $\omega_0$ and phase $\rho_1 + \pi/2$,
   (c) energizing a third RF magnetic field comprising vector amplitude $A_3$ along said symmetry axis, said third RF magnetic field comprising resonant frequency $\omega_0$ and phase $\rho_3$ in substantial concurrence with steps (a) and (b), wherein said amplitudes and phases are selected to produce a circularly polarized wave projected upon a plane orthogonal to $B_0$.

16. The method of claim 15, comprising the step of orienting said symmetry axis at the magic angle with respect to $B_0$.

* * * * *